(12) United States Patent
Meyer et al.

(10) Patent No.: US 8,691,013 B2
(45) Date of Patent: Apr. 8, 2014

(54) FEED TOOL FOR SHIELDING A PORTION OF A CRYSTAL PULLER

(75) Inventors: Benjamin Michael Meyer, Defiance, MO (US); Hariprasad Sreedharamurthy, Ballwin, MO (US); Steven Lawrence Kimbel, St. Charles, MO (US)

(73) Assignee: MEMC Singapore Pte Ltd, Singapore (SG)

( * ) Notice: Subject to any disclaimer, the term of this patent is extended or adjusted under 35 U.S.C. 154(b) by 308 days.

(21) Appl. No.: 13/103,554

(22) Filed: May 9, 2011

(65) Prior Publication Data

US 2012/0285373 A1    Nov. 15, 2012

(51) Int. Cl.
*C30B 15/14* (2006.01)
*C30B 15/00* (2006.01)
*C30B 15/20* (2006.01)
*C30B 15/02* (2006.01)

(52) U.S. Cl.
CPC ............. *C30B 15/00* (2013.01); *C30B 15/02* (2013.01); *C30B 15/14* (2013.01); *C30B 15/20* (2013.01)
USPC ........... 117/217; 117/200; 117/204; 117/206; 117/208; 117/214

(58) Field of Classification Search
CPC ........ C30B 15/00; C30B 15/02; C30B 15/14; C30B 15/20
USPC .............. 117/200, 204, 206, 208, 214, 217, 117/931–932
See application file for complete search history.

(56) References Cited

U.S. PATENT DOCUMENTS

| 5,922,127 | A | 7/1999 | Luter et al. |
| 6,660,082 | B2* | 12/2003 | Weber et al. ............ 117/19 |
| 6,663,709 | B2 | 12/2003 | Lu et al. |
| 7,491,270 | B2* | 2/2009 | Sasaki et al. ............ 117/200 |
| 2004/0112277 | A1 | 6/2004 | Kulkarni |
| 2004/0226504 | A1 | 11/2004 | Nakashima et al. |
| 2009/0314996 | A1* | 12/2009 | Kawazoe et al. ......... 252/500 |

FOREIGN PATENT DOCUMENTS

| EP | 1338682 A2 | 8/2003 |
| JP | 2004035357 | 2/2005 |
| JP | 2011032150 | 2/2011 |

OTHER PUBLICATIONS

International Search Report and Written Opinion of the International Searching Authority mailed on Aug. 2, 2012 regarding PCT/US20012/035971 filed on May 1, 2012, 9 pages.

* cited by examiner

*Primary Examiner* — Michael Kornakov
*Assistant Examiner* — Kenneth A Bratland, Jr.
(74) *Attorney, Agent, or Firm* — Armstrong Teasdale LLP

(57) ABSTRACT

A crystal puller for melting silicon and forming a single crystal ingot and a feed tool for shielding a portion of the crystal puller during charging of the crystal puller are disclosed herein. The crystal puller includes a crucible for containing molten silicon. The feed tool includes a cylinder and a plate. The cylinder has an inner surface and an annular ledge formed in a portion of the inner surface. The cylinder has a diameter at the annular ledge that is less than a diameter of the cylinder at the inner surface. The plate is positioned on the annular ledge and includes a first section separate from a second section. The first section and the second section are operable to move laterally with respect to each other. The plate has a central opening formed in at least one of the first section and the second section.

20 Claims, 7 Drawing Sheets

FEED TOOL FOR SHIELDING A PORTION OF A CRYSTAL PULLER

FIELD

This disclosure relates generally to crystal pullers used to produce single crystal silicon ingots and, more specifically, to feed tools used for shielding a portion of the crystal puller.

BACKGROUND

Single crystal silicon is the starting material in many processes for fabricating semiconductor electronic components. This silicon is commonly prepared in a crystal puller according to the Czochralski process. In this process, a single crystal silicon ingot is produced by melting polycrystalline silicon (i.e., polysilicon) in a crucible, dipping a seed crystal into the molten silicon, withdrawing the seed crystal in a manner sufficient to achieve the diameter desired for the ingot, and growing the ingot at that diameter.

After an ingot has been pulled from the molten silicon, some molten silicon may be left within the crucible in order to decrease the amount of time required to melt additional raw polysilicon subsequently charged into the crucible. A feed tool is also used during this subsequent charging to shield portions of the crystal puller from splatter caused when the raw polysilicon contacts the molten silicon.

During use, the feed tool is often subject to elevated temperatures compared to the temperatures at which it is stored when not in use. These changes in temperature result in the creation of thermal stresses within components of the feed tool. These stresses may in turn eventually cause the feed tool to deteriorate. Moreover, prior feed tools are often made from materials which deteriorate when contacted by silicon.

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

SUMMARY

One aspect is a crystal puller for melting silicon and forming a single crystal silicon ingot. The crystal puller comprises a crucible for containing molten silicon and having an open top portion and a feed tool for shielding a portion of the crystal puller during charging of the crucible with silicon. The tool comprises a cylinder having an inner surface and an annular ledge formed in a portion of the inner surface. The cylinder has a diameter at the annular ledge that is less than a diameter of the cylinder at the inner surface. A plate is positioned on the annular ledge and comprises a first section separate from a second section, the first section and the second section operable to move laterally with respect to each other. The plate has a central opening formed in at least one of the first section and the second section.

Another aspect is a feed tool for shielding a portion of a crystal puller during charging of the crystal puller with silicon, the crystal puller used in the production of silicon ingots. The tool comprises a cylinder having an inner surface, an outer surface, and an annular ledge formed in a portion of the inner surface of the cylinder. The cylinder has a diameter at the annular ledge that is less than a diameter of the cylinder at the inner surface and has at least a portion positioned on the annular ledge. The plate comprises a first section, a second section separate from the first section. The first section and the second section are connected together such that the sections are operable to move laterally with respect to each other. A central opening is formed in at least one of the first section and the second section. An annular member is positioned adjacent the central opening of the plate.

Still another aspect is a feed tool for shielding a portion of a crystal puller during charging of the crystal puller with a source material. The tool comprises a cylinder having an inner surface, an outer surface, and an annular ledge formed in the inner surface and a plate having at least a portion positioned on the annular ledge. The plate comprises a first section, a second section separate from the first section. The first section and the second section are connected together such that the sections are operably to move laterally with respect to each other. A central opening is formed in at least one of the first section and the second section. A cover is positioned atop the central opening of the plate and has a lower surface and a plurality of protrusions extending from the lower surface.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION OF THE INVENTION

Figure 1:
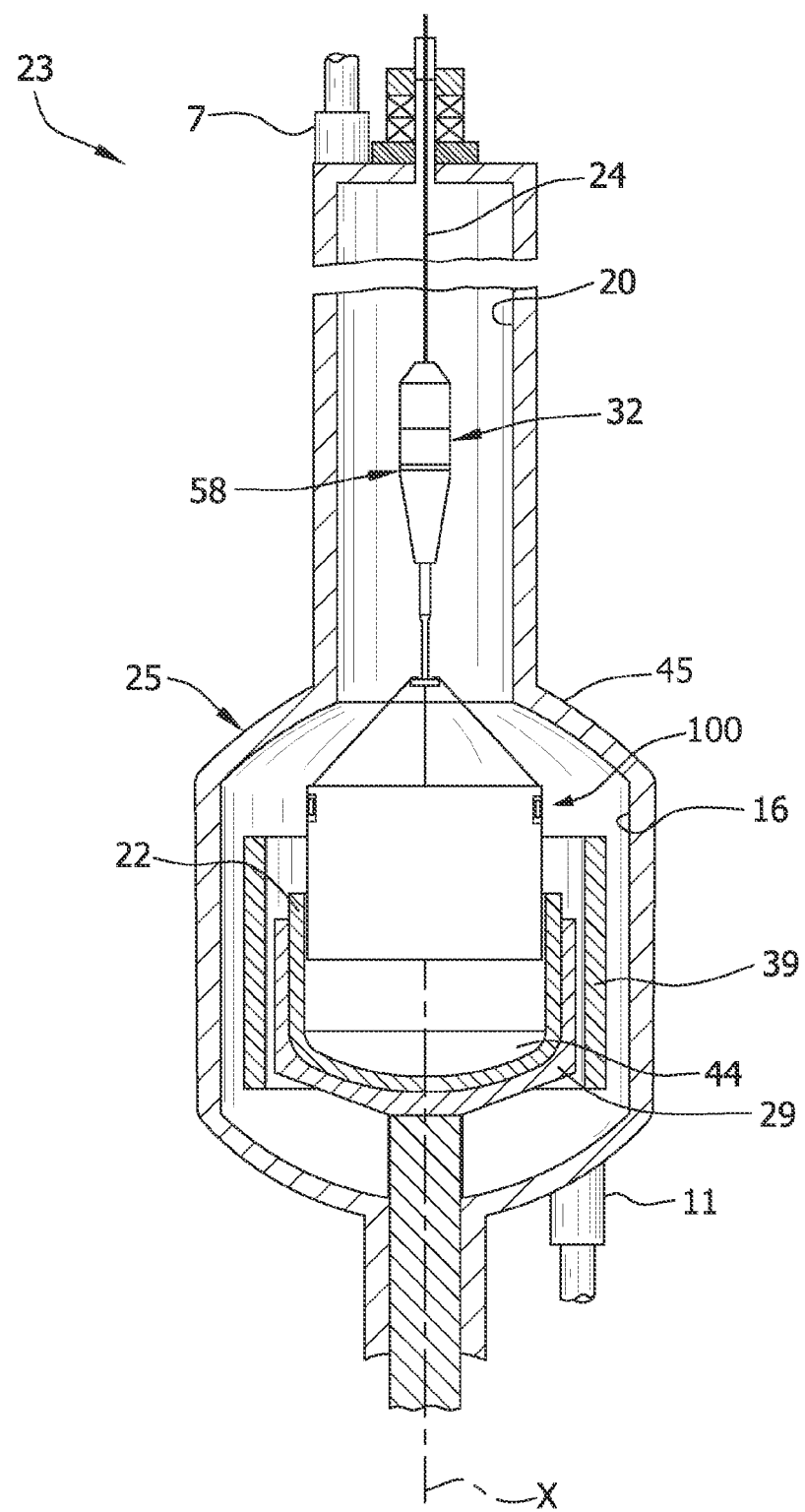
FIG. 1 is a schematic cross-sectional view of an example crystal puller and a feed tool positioned within the crystal puller.

Referring now to the drawings and in particular to FIG. 1, a crystal puller for use in accordance with the present disclosure of the type used to grow a multicrystalline silicon ingot according to the Czochralski method is designated by the reference numeral 23. The crystal puller 23 includes a housing 25 that defines a crystal growth chamber 16 and a pull chamber 20 having a smaller transverse dimension than the growth chamber. The growth chamber 16 has a generally dome shaped upper wall 45 transitioning from the growth chamber 16 to the narrowed pull chamber 20. The crystal puller 23 includes an inlet port 7 and an outlet port 11 which may be used to introduce and remove selective gases to and from the housing 25 during crystal growth.

A crucible 22 within the crystal puller 23 contains a silicon melt 44 from which a multicrystalline silicon ingot is drawn. The silicon melt 44 is obtained by melting polycrystalline silicon charged to the crucible 22. The crucible 22 is mounted on a turntable 29 for rotation of the crucible about a central longitudinal axis X of the crystal puller 23. In this regard, it should be understood that in certain embodiments, the crucible is not rotated. The crucible 22 is also capable of being raised within the growth chamber 16 to maintain the surface of the melt 44 at a generally constant level as the ingot is grown. An electrical resistance heater 39 surrounds the crucible 22 for melting the silicon charge to produce the melt 44. The heater 39 is controlled by a control system (not shown) so that the temperature of the melt 44 is precisely controlled throughout the pulling process. Insulation (not shown) surrounding the heater 39 may reduce the amount of heat lost through the housing 25.

A pulling mechanism (not shown) is attached to a pull wire 24 that extends down from the mechanism. The mechanism is capable of raising and lowering the pull wire 24. The crystal puller 23 may have a pull shaft rather than a wire, depending upon the type of puller. The pull wire 24 terminates in a pulling assembly 58 that includes a seed crystal chuck 32 which holds a seed crystal (not shown) used to grow the multicrystalline silicon ingot. In growing the ingot, the pulling mechanism lowers the seed crystal until it contacts the surface of the silicon melt 44. Once the seed crystal begins to melt, the pulling mechanism slowly raises the seed crystal up through the growth chamber 16 and pull chamber 20 to grow the monocrystalline or multicrystalline ingot. The speed at which the pulling mechanism rotates the seed crystal and the speed at which the pulling mechanism raises the seed crystal (i.e., the pull rate v) are controlled by the control system. The general construction and operation of the crystal puller 23, except to the extent explained more fully below, is conventional and known by those of ordinary skill in the art. The crystal puller described herein is thus configured to prepare cylindrical silicon ingots.

Figure 3:
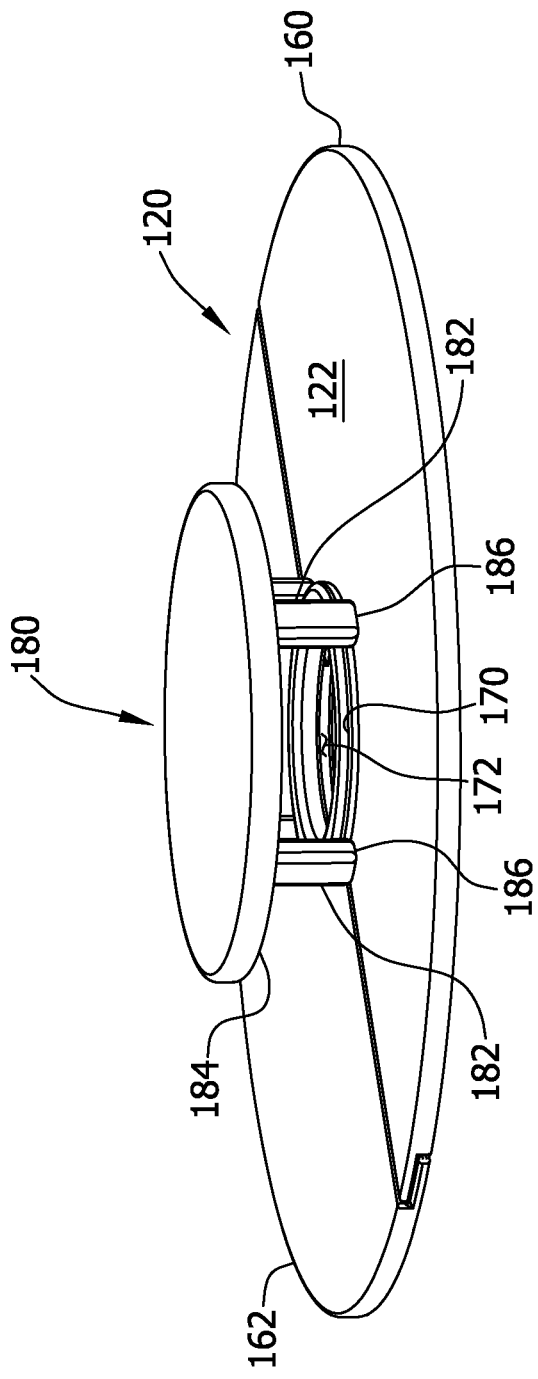
FIG. 3 is a perspective view of a plate, annular member, and cover of the feed tool of FIG. 2.
Figure 4:
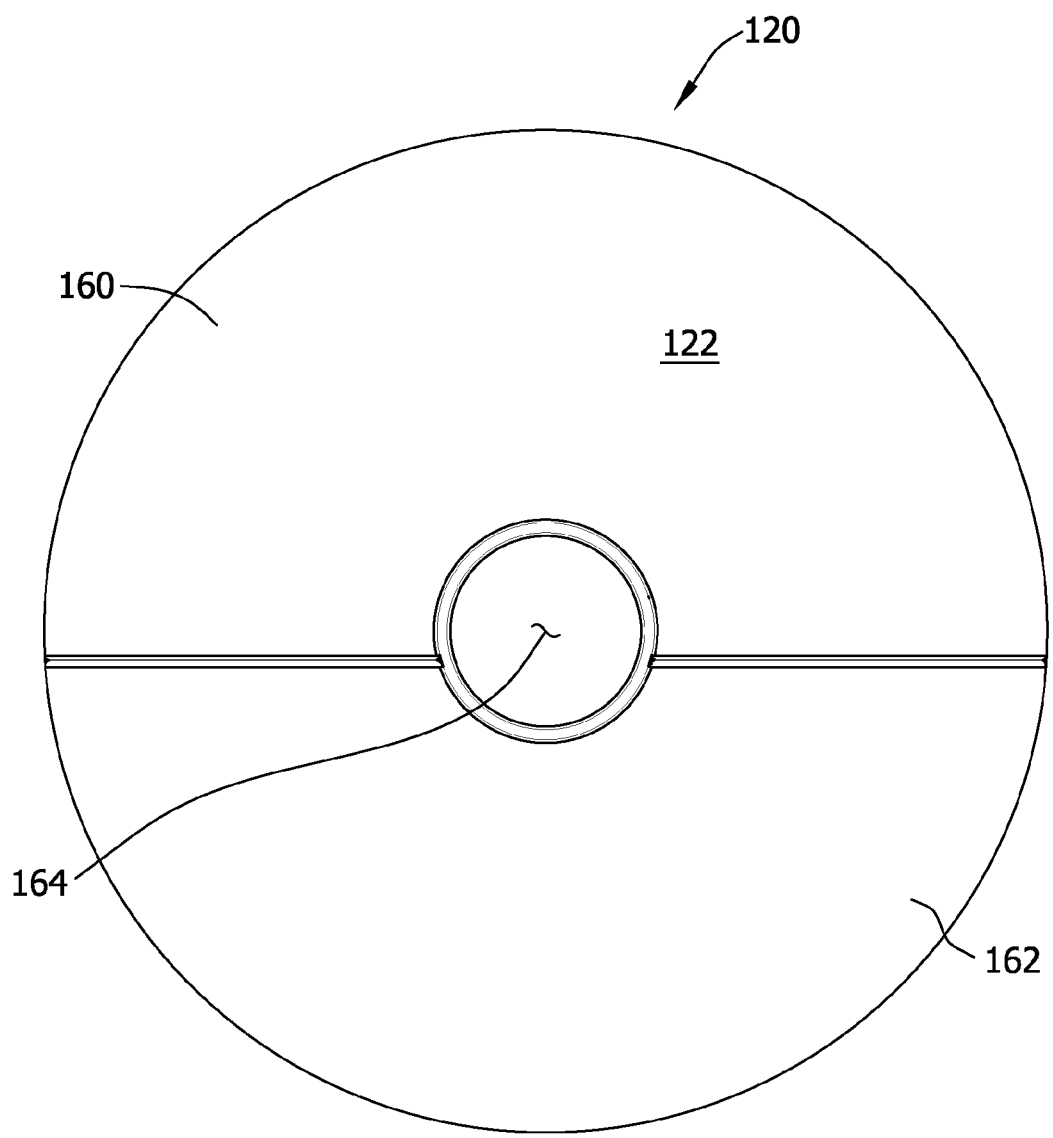
FIG. 4 is a top plan view of the plate of FIG. 3.
Figure 5:
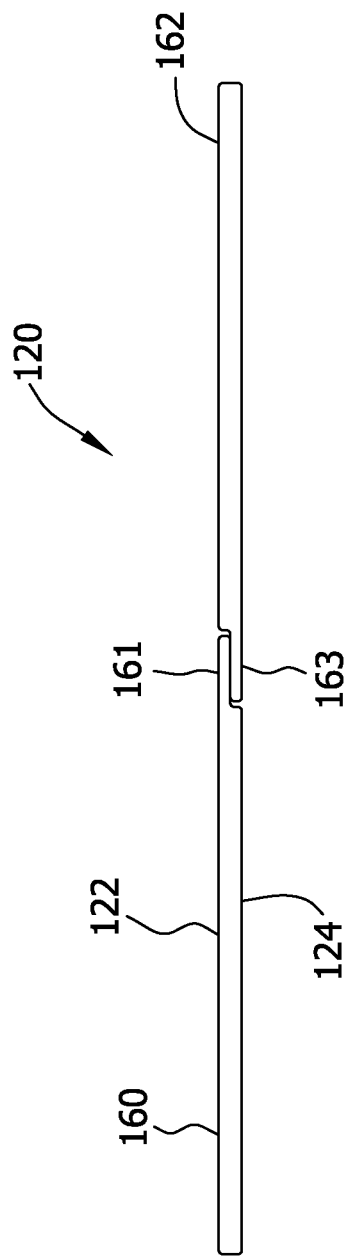
FIG. 5 is a side view of the plate of FIG. 4.
Figure 6:
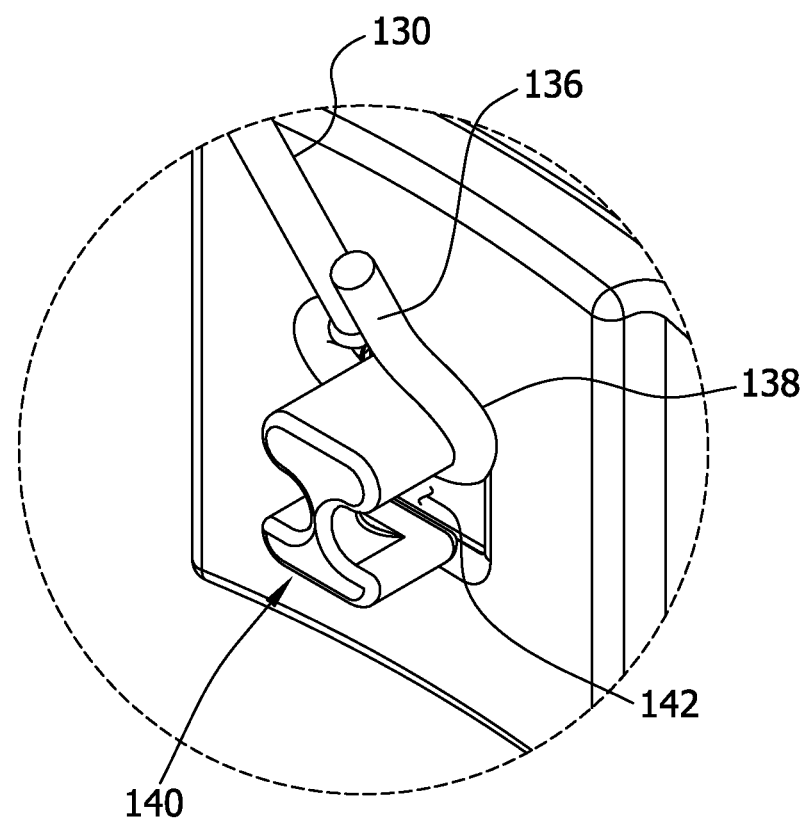
FIG. 6 is an enlarged view of a portion FIG. 2.

A feed tool 100 is shown schematically in FIG. 1 and in greater detail in FIGS. 2-6. The feed tool 100 broadly includes a cylinder 110 and a plate 120 positioned within the cylinder. The plate 120 has an upper surface 122 (FIGS. 2 and 4) and a lower surface 124 (FIG. 5).

Figure 2:
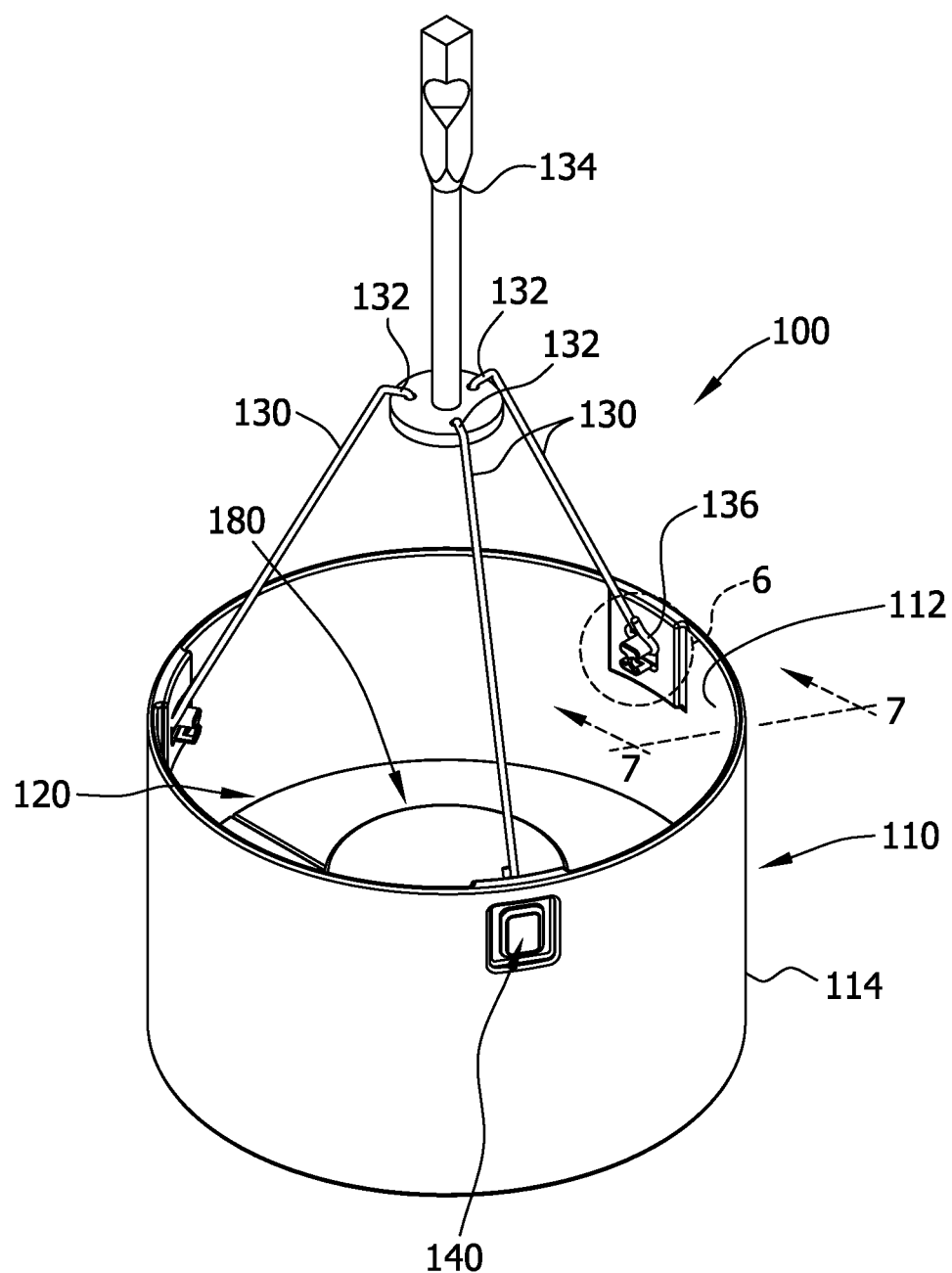
FIG. 2 is a perspective view of the exemplary feed tool of FIG. 1.

The feed tool 100 is connected to the pulling assembly 58 by three cables 130 in the example embodiment, as shown in FIG. 2. At a first end 132, the cables 130 are attached to a support structure 134 that is in turn connected to the pulling assembly 58. The support structure 134 is configured to be readily disconnected from the pulling assembly 58 when not in use. The cables 130 are attached at a second end 136 to attachment brackets 140 (FIG. 6) that are connected to the cylinder 110. The attachment brackets 140 are U-shaped structures that pass through openings 142 formed in the cylinder 110. Loops 138 formed in the respective second ends 136 of the cables 130 are retained within the attachment brackets 140. The cables 130 may be formed from any suitable non-reactive material that will not contaminate the crystal puller 23 or the melt 44 contained therein. Examples include steel, alloys thereof (e.g., stainless steel), or molybdenum. In other embodiments, rods or other suitable members may used in place of the cables 130.

Figure 7:
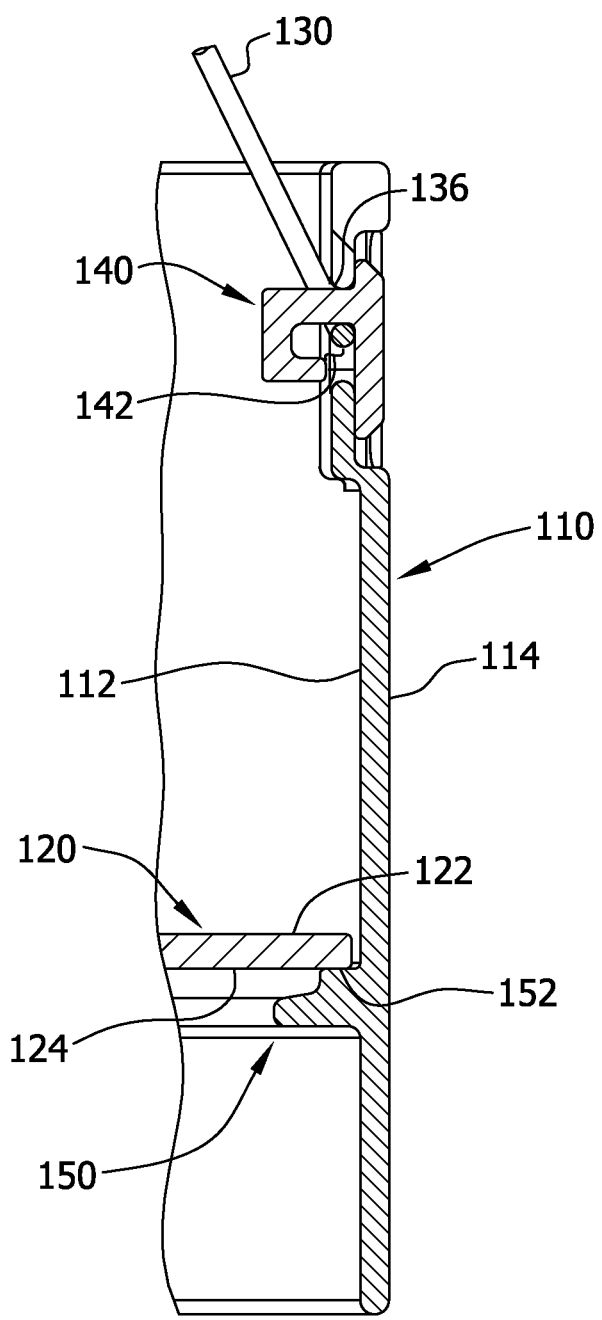
FIG. 7 is a partial cross-sectional view of FIG. 2.

As shown in FIGS. 2 and 7, the cylinder 110 has an inner surface 112 and an outer surface 114. An annular ledge 150 (best seen in FIG. 7) is formed in the inner surface 112 of the cylinder 110. The annular ledge 150 extends inward from the inner surface 112 of the cylinder 110 and has a support portion 152 which supports an outer portion of the plate 120. In other embodiments, a recess may be formed in the inner surface 112 of the cylinder to support the plate 120.

The plate 120, as best seen in FIGS. 4 and 5, includes a first section 160 and a separate second section 162. The plate 120 also includes a central opening 164 that is generally circular in shape. In the example embodiment, the central opening 164 is formed in a portion of both the first section 160 and the second section 162 of the plate 120. In other embodiments, the central opening 164 may be formed entirely within either the first section 160 or the second section 162. Moreover, the central opening 164 may be shaped differently (e.g., rectangular or oblong) without departing from the scope of the embodiments. The central opening 164 permits a gas (e.g., argon) to pass through the feed tool 100 and sweep over the melt 44.

The first section 160 and the second section 162 of the plate 120 are operable to move laterally with respect to each other. As shown in FIG. 5, the sections 160, 162 of the plate 120 are in an overlapping configuration (i.e., a ship-lapped configuration) to allow this lateral movement of the sections with respect to each other while still shielding the pulling assembly 58. In the example embodiment, a portion 161 of the first section 160 is disposed vertically above a portion 163 of the second section 162. In other embodiments, the sections 160, 162 are configured differently and the orientations of the portions 161, 163 are reversed such that the portion of the second section is disposed vertically above the portion of the first section. Moreover, other embodiments may use any arrangement of the interface of the first section 160 and the second section 162 that allows lateral movement of the sections with respect to each other.

This lateral movement of the sections 160, 162 accommodates the expansion and subsequent contraction of the plate 120 caused by its exposure to elevated temperatures with the crystal puller 23 during use. Moreover, as shown in FIG. 7, the plate 120 has a diameter that is less than the diameter of the cylinder 110 and the inner surface 112, but greater than the diameter of the cylinder at the support portion 152 of the ledge 150. The sections 160, 162 of the plate 120 are thus permitted to move laterally with respect to the cylinder 110 as well. Accordingly, the sections 160, 162 are not constrained from lateral movement and are thus able to expand and contract when heated and subsequently cooled.

As shown in FIG. 3, an annular member 170 is positioned adjacent the central opening 164 in the plate 120. The annular member 170 functions as a barrier and prevents or reduces the likelihood of particulates disposed on the upper surface of the plate 120 from travelling through the central opening 164 of the plate. The annular member 170 extends vertically upward from the upper surface 122 of the plate 120. A central opening 172 is formed in the annular member 170 that is of the approximate size as the central opening 164 of the plate 120. In the example embodiment, the central opening 172 of the annular member 170 has a diameter that is slightly less than a diameter of the central opening 164 in the plate 120. The annular member 170 is also separate from the sections 160, 162 of the plate 120 in the example embodiment. In other embodiments, the annular member 170 may be a multi-piece structure having pieces that are integrally formed with the respective sections 160, 162 of the plate 120. Furthermore, in some embodiments an annular member may be omitted.

A cover 180, as shown in FIG. 3, is positioned atop the central openings 164, 172 of the plate 120 and the annular member 170. A plurality of protrusions 182 extend from a lower surface 184 of the cover 180. Ends 186 of the protrusions 182 are in contact with the upper surface 122 of sections 160, 162 of the plate 120. In other embodiments, some or all of the protrusions 182 may be in contact with the annular member 170. Four protrusions 182 are provided in the example embodiment, although other embodiments may have a different number of protrusions.

The cover 180 is spaced from the central openings 164, 172 by the protrusions 182 such that a gap is formed between the central openings and the cover. This gap permits gas to flow through the central openings 164, 172 while still permitting the tool 100 to shield portions of the crystal puller 23 from splatter that would otherwise be permitted to travel through the central openings 164, 172. While protrusions 182 are used in the example embodiment to space the cover 180 from the central openings 164, 172, other embodiments may use a protrusion that is substantially continuous and has perforations or other openings formed therein to permit to gas to flow through the central openings.

In the example embodiment, the components of the feed tool 100 are formed from graphite and coated with silicon-carbide. Silicon that contacts the coating of the feed tool 100 does not adhere to the coating. Moreover, the coating is not appreciably damaged by contact with silicon and any silicon that contacts the coating may melt if the surface temperature is hot enough. Accordingly, the coating will not separate from the feed tool 100 when contacted by silicon and contaminate the crystal puller 23 or the melt 44 contained therein. This is in contrast to prior feed tools made of quartz or similar materials. In other embodiments, the entirety of the feed tool 100 may be made of silicon-carbide, and the graphite is omitted. In other embodiments, the feed tool may be formed from any suitable material that will not appreciably contaminate the crystal puller or melt contained therein or be appreciably damaged by contact with silicon.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A crystal puller for melting silicon and forming a single crystal silicon ingot, the crystal puller comprising:
   a crucible for containing molten silicon, the crucible having an open top portion; and
   a feed tool for shielding a portion of the crystal puller during charging of the crucible with silicon, the tool comprising:
      a cylinder having an inner surface and an annular ledge formed in a portion of the inner surface, the cylinder having a diameter at the annular ledge that is less than a diameter of the cylinder at the inner surface; and
      a plate positioned on the annular ledge, the plate comprising a first section separate from a second section, the first section and the second section operable to move laterally with respect to each other, the plate having a central opening formed in at least one of the first section and the second section, wherein a portion of the first section and a portion of the second section overlap one another.

2. The crystal puller of claim 1 wherein the feed tool shields a portion of the crystal puller disposed vertically above the crucible.

3. The crystal puller of claim 1 wherein the portion of the first section is disposed vertically above the portion of the second section.

4. The crystal puller of claim 1 wherein the portion of the second section is disposed vertically above the portion of the first section.

5. The crystal puller of claim 1 further comprising an annular member positioned adjacent the central opening of the plate, the annular member extending vertically upward from the plate.

6. The crystal puller of claim 5 wherein the annular member has a central opening adjacent the central opening of the plate.

7. The crystal puller of claim 1 further comprising a cover positioned atop the central opening in the plate, the cover spaced from the central opening such that a gap is formed between the central opening and the cover.

8. The crystal puller of claim 7 wherein the cover has a lower surface and a plurality of protrusions extending from the lower surface, the plurality of protrusions in contact with at least one of the annular member and the plate.

9. The crystal puller of claim 1 further comprising a plurality of connecting members operable for connecting the cylinder to the crystal puller.

10. A feed tool for shielding a portion of a crystal puller during charging of the crystal puller with silicon, the crystal puller used in the production of silicon ingots, the tool comprising:
    a cylinder having an inner surface, an outer surface, and an annular ledge formed in a portion of the inner surface of the cylinder, the cylinder having a diameter at the annular ledge that is less than a diameter of the cylinder at the inner surface;
    a plate having at least a portion positioned on the annular ledge, the plate comprising:
       a first section;
       a second section separate from the first section, the first section and the second section connected together such that the sections are operable to move laterally with respect to each other; and
       a central opening formed in at least one of the first section and the second section; and
    an annular rim positioned adjacent the central opening of the plate, wherein the annular rim is formed separately from and supported by the plate.

11. The feed tool of claim 10 wherein a portion of the first section of the plate and a portion of the second section of the plate are in an overlapping configuration.

12. The feed tool of claim 10 wherein the annular rim extends vertically upwards from the plate.

13. The feed tool of claim 12 wherein the annular rim has a central opening adjacent the central opening of the plate.

14. The feed tool of claim 13 further comprising a cover positioned atop the central opening of the plate and the central opening of the annular rim, the cover spaced from the central openings such that a gap is formed between the central openings and the cover.

15. The feed tool of claim 14 wherein the cover has a lower surface and a plurality of protrusions extending from the lower surface, the plurality of protrusions in contact with at least one of the annular rim and the plate.

16. A feed tool for shielding a portion of a crystal puller during charging of the crystal puller with a source material, the tool comprising:
    a cylinder having an inner surface, an outer surface, and an annular ledge formed in the inner surface;
    a plate having at least a portion positioned on the annular ledge, the plate comprising:
       a first section;
       a second section separate from the first section, the first section and the second section connected together such that the sections are operable to move laterally with respect to each other; and a central opening formed in at least one of the first section and the second section; and a cover positioned atop the central opening of the plate, the cover having a lower surface and a plurality of protrusions extending from the lower surface.

17. The feed tool of claim 16 wherein the plurality of protrusions are in contact with the plate adjacent the central opening.

18. The feed tool of claim 17 wherein the protrusions space the lower surface of the cover from the central opening such that a gap is formed between the central opening and the cover.

19. The feed tool of claim 16 wherein a portion of the first section of the plate and a portion of the second section of the plate are in an overlapping configuration.

20. The feed tool of claim 10 wherein the annular rim extends vertically upwards from an upper surface of the plate.

\* \* \* \* \*